United States Patent
Watanabe et al.

(10) Patent No.: US 11,933,936 B2
(45) Date of Patent: Mar. 19, 2024

(54) OPTICAL SENSOR

(71) Applicant: Murata Manufacturing Co., Ltd., Nagaokakyo (JP)

(72) Inventors: Hiroshi Watanabe, Nagaokakyo (JP); Kohei Sugahara, Nagaokakyo (JP); Takatoshi Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 31 days.

(21) Appl. No.: 17/746,176

(22) Filed: May 17, 2022

(65) Prior Publication Data

US 2022/0276405 A1 Sep. 1, 2022

Related U.S. Application Data

(63) Continuation of application No. PCT/JP2020/030070, filed on Aug. 5, 2020.

(30) Foreign Application Priority Data

Nov. 18, 2019 (JP) .................................. 2019-208138

(51) Int. Cl.
 *G01V 8/14* (2006.01)
 *H01L 31/02* (2006.01)
(52) U.S. Cl.
 CPC .......... *G01V 8/14* (2013.01); *H01L 31/02024* (2013.01)
(58) Field of Classification Search
 CPC ....... G01V 8/10; G01V 8/14; H01L 31/02024
 See application file for complete search history.

(56) References Cited

U.S. PATENT DOCUMENTS

| | | |
|---|---|---|
| 2010/0253650 A1 | 10/2010 | Dietzel et al. |
| 2011/0188025 A1 | 8/2011 | Haas et al. |
| 2014/0103199 A1 | 4/2014 | Loong et al. |
| 2015/0177082 A1 | 6/2015 | Sawada et al. |

(Continued)

FOREIGN PATENT DOCUMENTS

| | | |
|---|---|---|
| JP | 2010-539474 A | 12/2010 |
| JP | 2011-525239 A | 9/2011 |

(Continued)

OTHER PUBLICATIONS

Official Communication issued in International Patent Application No. PCT/JP2020/030070, dated Oct. 27, 2020.

*Primary Examiner* — Kevin K Pyo
(74) *Attorney, Agent, or Firm* — Keating & Bennett, LLP

(57) ABSTRACT

An optical sensor includes a light source, a light receiver, and a convex portion. The light source emits light to an object. The light receiver receives reflected light of the emitted light reflected by an object and generates a signal showing a light reception result. The convex portion has a height higher than a height of the light source and the light receiver. The convex portion is between the light source and the light receiver to block reflected light from the light receiver when light from the light source is reflected within a range of a predetermined distance from the convex portion. The light receiver outputs a signal to show a light reception result of equal to or less than a threshold amount of light indicating that the reflected light is not received in response to proximity of the object being within a range of a predetermined distance.

15 Claims, 15 Drawing Sheets

(56) References Cited

U.S. PATENT DOCUMENTS

| | | |
|---|---|---|
| 2015/0177366 A1 | 6/2015 | Halbritter |
| 2017/0297206 A1 | 10/2017 | Correll |
| 2019/0341518 A1 | 11/2019 | Chua et al. |
| 2020/0057158 A1* | 2/2020 | Chua .................... G01S 7/4813 |

FOREIGN PATENT DOCUMENTS

| | | |
|---|---|---|
| JP | 2015-525478 A | 9/2015 |
| JP | 5825604 B2 | 12/2015 |
| WO | 2014/045685 A1 | 3/2014 |

\* cited by examiner

OPTICAL SENSOR

CROSS REFERENCE TO RELATED APPLICATIONS

This application claims the benefit of priority to Japanese Patent Application No. 2019-208138 filed on Nov. 18, 2019 and is a Continuation application of PCT Application No. PCT/JP2020/030070 filed on Aug. 5, 2020. The entire contents of each application are hereby incorporated herein by reference.

BACKGROUND OF THE INVENTION

1. Field of the Invention

The present invention relates to an optical sensor for detecting proximity of an object in an optical method.

2. Description of the Related Art

In recent years, various sensors that are mounted on a robot hand or the like and enable various types of sensing, such as proximity or contact of an object, have been proposed (for example, U.S. Patent Application Publication No. 2017/0297206, Japanese Patent No. 5825604 and International Publication No. 2014/045685).

U.S. Patent Application Publication No. 2017/0297206 discloses a system for measuring a contact force by an object, a distance to the object, and the like during an operation. such as gripping of the object by a robot. In the system of U.S. Patent Application Publication No. 2017/0297206, a force, a distance, and contact are measured using a signal of an infrared proximity sensor embedded in an elastomer having light transmissive property to infrared light.

Japanese Patent No. 5825604 discloses an optical tactile sensor capable of measuring a six-axis force. International Publication No. 2014/045685 discloses a force sensor that detects a shear force using a variable frame. In Japanese Patent No. 5825604 and International Publication No. 2014/045685, sensing of various contact forces by an object is performed in an optical mechanism using deformation of an elastic body.

In the related art, such as U.S. Patent Application Publication No. 2017/0297206, an amount of reflected light of infrared light from an object is used as a signal of an infrared proximity sensor. However, the amount of reflected light varies depending on the reflectance of the target object, and the absolute value of the amount of reflected light in a state in which contact is assumed changes. For this reason, it is difficult to separately sense, for example, whether various objects are changed in the amount of light in accordance with approach or are pushed into the sensor in a contact state.

SUMMARY OF THE INVENTION

Preferred embodiments of the present invention provide optical sensors that are each able to detect proximity of an object to a specific distance without depending on the reflectance of the object.

An optical sensor according to a preferred embodiment of the present invention detects proximity of an object in accordance with a light reception result. The optical sensor includes a light source, a light receiver, and a convex portion. The light source emits light to the object. The light receiver receives reflected light of the emitted light being reflected by the object and generates a signal indicating a light reception result. The convex portion has a height higher than a height of the light source and the light receiver. The convex portion is between the light source and the light receiver so as to block reflected light from the light receiver when light from the light source is reflected within a range of a predetermined distance from the convex portion. The light receiver outputs a signal to show a light reception result of equal to or less than a threshold amount of light indicating that the reflected light is not received in response to proximity of the object reaching within a range of a predetermined distance. The threshold amount of light at which the reflected light can be regarded as not being received is set in advance to equal to or less than about 10% of optical output power output from the light source.

According to preferred embodiments of the present invention, it is possible to accurately detect proximity of an object to a specific distance regardless of the reflectance of the object.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, optical sensors according to preferred embodiments of the present invention will be described with reference to the accompanying drawings.

Each preferred embodiment is an example, and a partial replacement or combination of configurations shown in different preferred embodiments is possible. In Preferred Embodiment 2 and subsequent preferred embodiments, description of items common to Preferred Embodiment 1 will be omitted, and only different points will be described. In particular, the same operation and effect of the same configuration will not be described in each preferred embodiment.

Preferred Embodiment 1

1. Configuration

Figure 1:
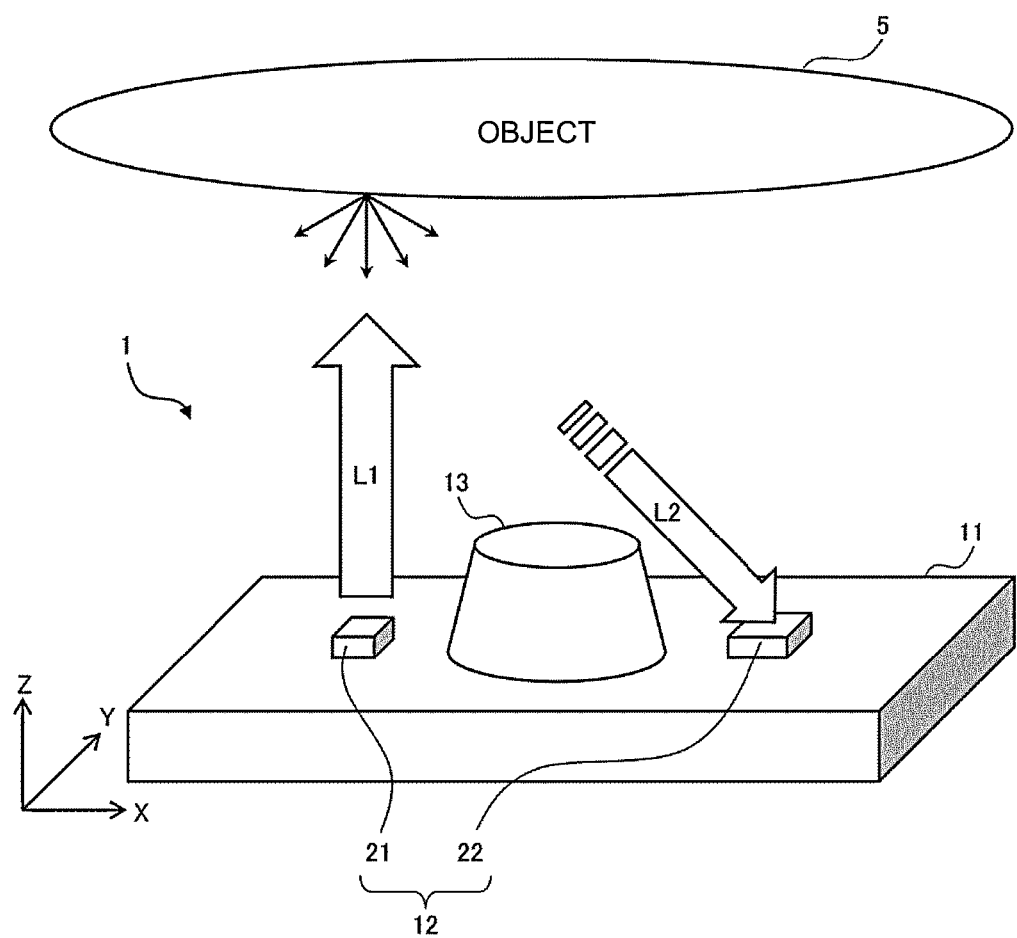
FIG. 1 is a diagram illustrating an outline of an optical sensor according to Preferred Embodiment 1 of the present invention.

A configuration of an optical sensor according to Preferred Embodiment 1 of the present invention will be described with reference to FIG. 1. FIG. 1 is a diagram for explaining an outline of an optical sensor 1 according to the present preferred embodiment.

The optical sensor 1 of the present preferred embodiment is a module in which a proximity sensor 12 that detects proximity of a target object 5 in an optical detection method and a force sensor 13 that detects a force acting when the target object 5 comes into contact (that is, a contact force) are integrally provided. The optical sensor 1 is applicable to an application of detecting various objects to be gripped as the target object 5 in a robot hand, for example. The optical sensor 1 can continuously detect a series of processes, such as a process in which the target object 5 approaches and comes into contact with the optical sensor 1 to apply a force, by the proximity sensor 12 and the force sensor 13.

In the optical sensor 1, the proximity sensor 12 includes a light source 21 to emit detection light L1 for detecting proximity of the target object 5 and a light receiver 22 to receive light entering from the outside. According to the proximity sensor 12, the light receiver 22 receives reflected light L2 of the detection light L1 reflected on the target object 5, and thus proximity of the target object 5 is detected.

In a general optical proximity detection method, there has been a problem in that even when distances of proximity of various target objects 5 are to the same or substantially the same extent, since the amount of the reflected light L2 changes depending on the reflectance of each target object 5, it is difficult to detect the extent to which the target object 5 approaches. On the other hand, the present preferred embodiment provides an optical sensor 1 capable of detecting that the target object 5 is in proximity to a specific distance regardless of the reflectance of the target object 5.

1-1. Details of Configuration

Hereinafter, the configuration of the optical sensor 1 according to the present preferred embodiment will be described in detail.

Figure 2:
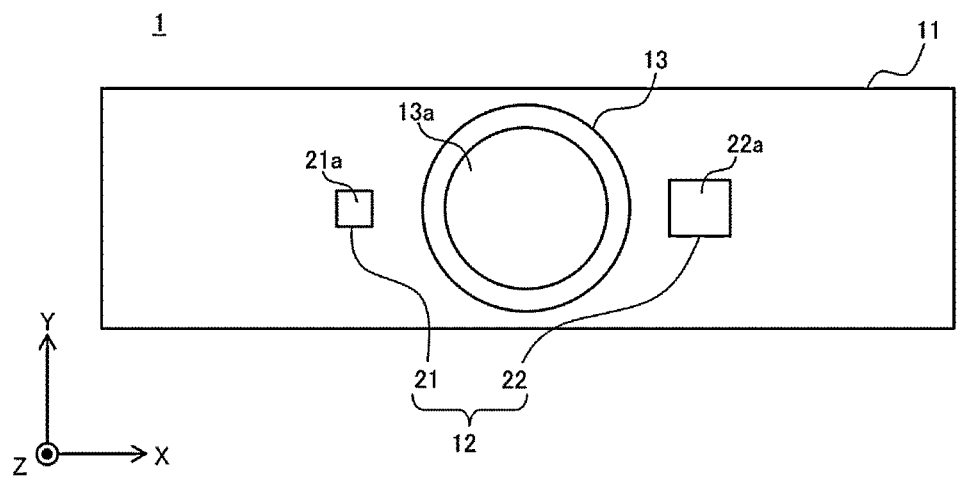
FIG. 2 is a plan view of the optical sensor according to Preferred Embodiment 1 of the present invention.

FIG. 2 is a plan view of the optical sensor 1 according to the present preferred embodiment. The optical sensor 1 includes the proximity sensor 12 and the force sensor 13 on a substrate 11, for example. Hereinafter, two directions parallel or substantially parallel to a main surface of the substrate 11 are referred to as an X direction and a Y direction, respectively, and a normal direction of the main surface is referred to as a Z direction.

In the optical sensor 1 of the present preferred embodiment, the light source 21 and the light receiver 22 of the proximity sensor 12 are arranged on the substrate 11 so as to sandwich the force sensor 13 in, for example, the X direction. Hereinafter, a +Z side where the force sensor 13 protrudes from the substrate 11 may be referred to as an upper side, and a −Z side which is the opposite side may be referred to as a lower side. The arrangement of the proximity sensor 12 and the force sensor 13 in the optical sensor 1 will be described in detail below.

Figure 3:
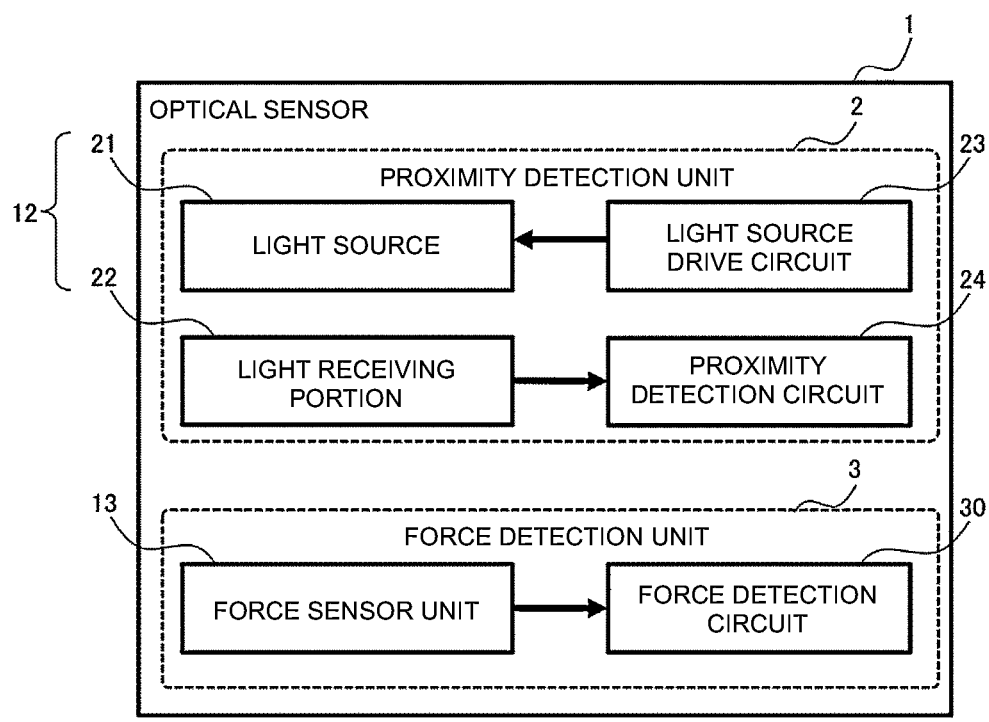
FIG. 3 is a block diagram illustrating a configuration of the optical sensor according to Preferred Embodiment 1 of the present invention.

FIG. 3 is a block diagram illustrating the configuration of the optical sensor 1 according to the present preferred embodiment. The optical sensor 1 of the present preferred embodiment includes a proximity detector 2 including the proximity sensor 12, a light source drive circuit 23, and a proximity detection circuit 24, and a force detector 3 including a force sensor 13 and a force detection circuit 30.

In the proximity detector 2, the light source 21 includes a light emitter, such as, for example, a single or multi-emitter surface emitting laser (VCSEL), and has narrow directivity. For example, the light source 21 emits light having a predetermined waveband such as an infrared region and includes a light emitting surface 21a to emit the light as the detection light L1. The light source 21 is arranged with the light emitting surface 21a facing upward.

The light source 21 is not limited to the VCSEL, and may include, for example, various solid-state light emitting elements such as a semiconductor laser (LD) or an LED. The light source 21 may include a plurality of light emitter. The light source 21 may include an optical system such as, for example, a lens and a mirror to collimate light from the light emitter.

The light receiver 22 includes one or a plurality of light receivers such as, for example, a photodiode (PD), and includes a light receiving surface 22a including the light receiver. The light receiver 22 receives light such as the reflected light L2 of the detection light L1 on the light receiving surface 22a and generates, for example, a light reception signal indicating the amount of received light as a light reception result.

The light receiver 22 is not limited to the PD, and may include various light receivers such as, for example, a phototransistor, a position detector (PSD), a CMOS image sensor (CIS), or a charge-coupled device (CCD). The light receiver 22 may include a linear array or a two-dimensional array of light receivers. The light receiver 22 may include an optical system such as, for example, a lens to focus the reflected light L2. In addition, a band pass filter or the like that blocks light in a waveband different from the waveband of the detection light L1 may be provided on the light receiving surface 22a of the light receiver 22. As a result, the influence of ambient light due to the external environment can be reduced or prevented.

The light source drive circuit 23 supplies a drive signal to emit the detection light L1 to the light source 21. The light source drive circuit 23 may include a modulator such, for example, as an AM modulator. For example, the light source drive circuit 23 may modulate the detection light L1 by using specific frequencies from about 10 Hz to about 1 MHz or the like as modulation frequencies that periodically vary the amplitudes of light. By modulating the detection light L1, it becomes easy to distinguish the detection light L1 and its reflected light L2 from the ambient light.

The proximity detection circuit 24 performs various types of signal processing on the light reception signal output from the light receiver 22 to generate a proximity detection signal. The signal processing includes, for example, various types of arithmetic processing to estimate distances to the target object 5 and variations thereof in accordance with the light amount of the light reception result, and may include processing to extract the amount of the reflected light L2 from the light reception result. The proximity detection signal can be set to various signals indicating the detection result of the proximity of the target object 5 according to each of the various types of signal processing. In addition, the proximity detection circuit 24 may include a circuit configuration to drive the light receiver 22, and may include a sensor amplifier or the like to amplify a signal output from the light receiver. Such a circuit configuration may be included in the light receiver 22 together with the light receiver.

For example, the proximity detection circuit 24 may perform filter processing such as a band pass filter that allows signal components including the modulation frequency of the detection light L1 to pass, or may perform synchronous detection in synchronization with the light source drive circuit 23. For example, in the proximity detection circuit 24, it is possible to analyze the reflected light L2 separately from the ambient light by blocking the stationary DC-component. The modulation frequency of the detection light L1 can be appropriately set while avoiding frequencies used in existing external systems, such as about 38 kHz used as carriers of infrared remote controllers, for example. As a result, malfunction of the optical sensor 1 caused by an external system can be reduced or prevented.

In the force detector 3 of the present preferred embodiment, various force detection methods can be used to detect the force from the target object 5. Various force detection methods are, for example, piezoelectric, optical, strain resistive, and electrostatic capacitive. The force detector 3 detects a force in multiple axes such as, for example, three axes or six axes.

The force sensor 13 defines a portion with which the target object 5 comes into contact when detecting a force from the target object 5 in the force detection method. The force sensor includes a sensor in the force detection method, a package thereof, and the like. For example, the force sensor 13 has a truncated conical shape and comes into contact with the target object 5 at an upper surface 13a. The shape of the force sensor 13 is not particularly limited, and may be, for example, various convex shapes. The force sensor 13 is an example of a convex portion in the optical sensor 1 of the present preferred embodiment.

The force detection circuit 30 generates a force detection signal indicating a detection result of a force in multiple axes, for example, based on a signal output from a sensor in the force sensor 13. The force detection circuit 30 may output a force detection signal as a detection result of a force of not only the multiple axes but also one axis. The force detection circuit 30 may include a circuit configuration to drive the sensor, and may include a sensor amplifier or the like to amplify a signal output from the sensor.

The configuration described above is an example, and the optical sensor 1 is not particularly limited to the above-described configuration. For example, the optical sensor 1 of the present preferred embodiment may include any of the circuits 23, 24, and 30 as an external configuration, or may be provided as a module separate from the circuits 23, 24, and 30.

1-2. Arrangement of Proximity Sensor and Force Sensor

The arrangement of the proximity sensor 12 and the force sensor 13 in the optical sensor 1 will be described in detail with reference to FIG. 4.

Figure 4:
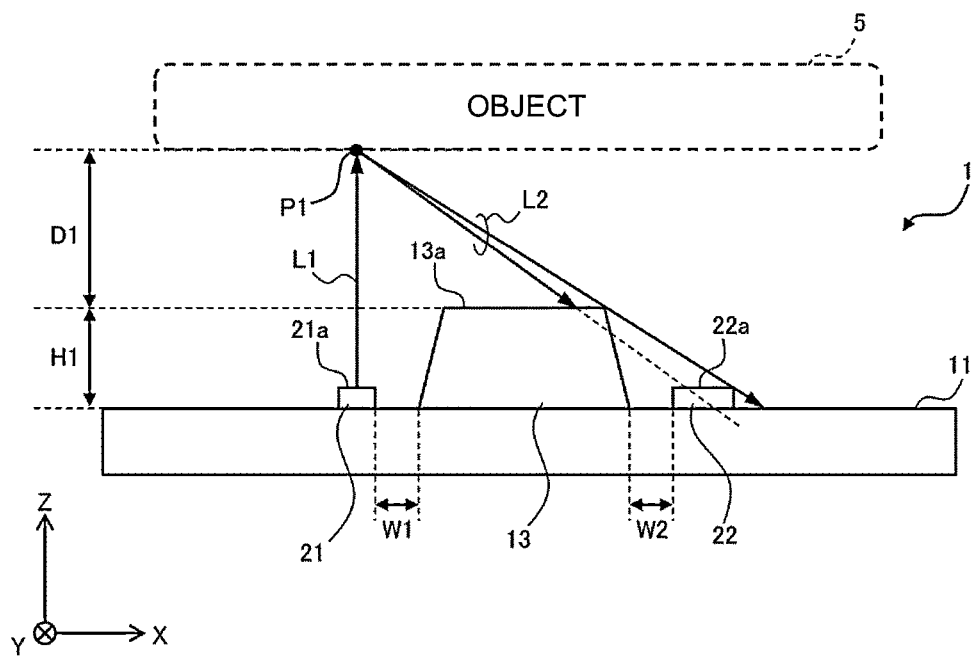
FIG. 4 is a diagram illustrating a threshold distance in the optical sensor.

FIG. 4 is a diagram illustrating a threshold distance D1 in the optical sensor 1. In the present preferred embodiment, the light source 21, the light receiver 22 (the proximity sensor 12), and the force sensor 13 are arranged so that the optical sensor 1 has the threshold distance D1. The threshold distance D1 is a boundary distance at which the reflected light L2 of the detection light L1 emitted from the light source 21 is blocked by the force sensor 13 and the reflected light L2 entering the light receiving surface 22a of the light receiver 22 has an amount equal to or less than a set threshold amount of light. The threshold amount of light indicates a reference amount of light at which the reflected light L2 is considered not to be received. The threshold amount of light is set in advance to, for example, equal to or less than about 10% of optical output power output from the light source 21.

FIG. 4 corresponds to a side view of the optical sensor 1 viewed from the Y direction. In the present preferred embodiment, the force sensor 13 has a height H1 in which the upper surface 13a protrudes above the light emitting surface 21a of the light source 21 and the light receiving surface 22a of the light receiver 22. In other words, the light source 21 and the light receiver 22 are provided at a position lower than the upper surface 13a of the force sensor 13. Further, the force sensor 13 is arranged between the light source 21 and the light receiver 22 of the proximity sensor 12, and the light source 21 is smaller than the force sensor 13. In addition, the light source 21 is arranged such that a distance between the light source 21 and the force sensor 13, that is an interval W1 is shorter than the height H1 of the force sensor 13. With such an arrangement, it is possible to cause a phenomenon in which the force sensor 13 blocks reception of the reflected light L2 in accordance with distances between the target object 5 and the optical sensor 1.

FIG. 4 illustrates optical paths of the detection light L1 and the reflected light L2 in a case where the target object 5 is positioned at the threshold distance D1. The distance between the target object 5 and the optical sensor 1 can be defined along the Z direction with reference to the upper surface 13a of the force sensor 13.

In the example of FIG. 4, the detection light L1 travels upward from the light source 21 along the Z direction by the threshold distance D1 and is reflected at a reflection position P1 located at the same distance D1. In the optical path of the reflected light L2 from the reflection position P1, an optical path linearly directed to the light receiver 22 overlaps the force sensor 13 on the way. Therefore, components of the reflected light L2 that travel along the optical path enter the force sensor 13 and are blocked. On the other hand, components of the reflected light L2 traveling in the optical path that does not overlap the force sensor 13 travel away from the light receiver 22 and do not reach the light receiving surface 22a.

As described above, the reflected light L2 from the reflection position P1 of the threshold distance D1 is blocked by the force sensor 13 and is not received by the light receiver 22. In addition, similarly to the above, the light receiver 22 does not receive the reflected light L2 from a reflection position closer to the optical sensor 1 than the threshold distance D1. On the other hand, the reflected light L2 from a reflection position farther than the threshold distance D1 has an optical path toward the light receiver 22 without overlapping the force sensor 13, and can reach the light receiving surface 22a.

In the present preferred embodiment, the above-described threshold distances D1 can be set in advance to desired sizes according to various specifications of the optical sensor 1 by adjusting parameters of dimensions and layout at the time of manufacturing the optical sensor 1, for example. The threshold distance D1 is an example of predetermined distances in the optical sensor 1 of the present preferred embodiment.

Parameters capable of adjusting the threshold distance D1 include, for example, the interval W1 between the light source and the force sensor 13, an interval W2 between the light receiver 22 and the force sensor 13, and the like. In the example of FIG. 4, the larger the interval W1 is, the larger the threshold distance D1 can be. On the other hand, the smaller the interval W2 is, the larger the threshold distance D1 can be. In addition, the parameters of the threshold distance D1 are not limited to the intervals W1 and W2, and may include, for example, the size and shape of the height H1 or the like of the force sensor 13, the size and shape of the height or the like of the light source 21, and the size and shape of the height or the like of the light receiver 22.

In addition, according to the optical sensor 1 as described above, since the light source 21 and the light receiver 22 are located at a position lower than the upper surface 13a of the force sensor 13, it is possible to easily avoid a situation in which the target object 5 comes into contact with and damages the light source 21 and the light receiver 22. In addition, with the above-described configuration, it is possible to provide the optical sensor 1 that is small and inexpensive.

2. Operation

The operation of the optical sensor 1 configured as described above will be described below.

2-1. Outline of Operation

An outline of the operation of the optical sensor 1 according to the present preferred embodiment will be described with reference to FIGS. 5A and 5B.

In the optical sensor 1 of the present preferred embodiment, the light source drive circuit 23 drives the light source 21 by a drive signal and causes the light source 21 to emit the detection light L1. The light source 21 emits the detection light L1 upward along the Z direction, for example. When the detection light L1 enters the target object 5, the detection light L1 is, for example, diffusely reflected according to the reflectance of the target object 5.

Figure 5A:
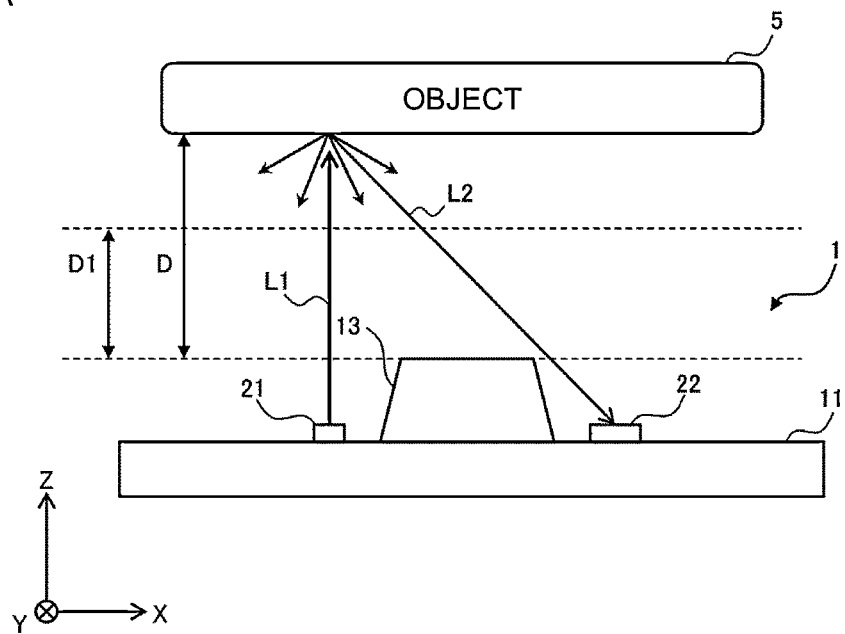
FIGS. 5A and 5B are diagrams for explaining an outline of an operation of the optical sensor.

FIG. 5A illustrates a state in which the target object 5 is separated from the optical sensor 1 by a distance D. FIG. 5B illustrates a state in which the target object 5 approaches from the state of FIG. 5A and is in contact with the optical sensor 1. In the state illustrated in FIG. 5A, the distance D to the target object 5 is larger than the threshold distance D1.

In the example of FIG. 5A, the reflected light L2 of the detection light L1 in the target object 5 enters the light receiver 22. In the optical sensor 1, the proximity detection circuit 24 generates a proximity detection signal based on the light reception result of the light receiver 22. Since the amount of the reflected light L2 received by the light receiver 22 varies depending on the distance D to the target object 5, various calculations to estimate the distance to the target object 5 based on the light reception signal can be applied to the proximity detection circuit 24.

Figure 5B:
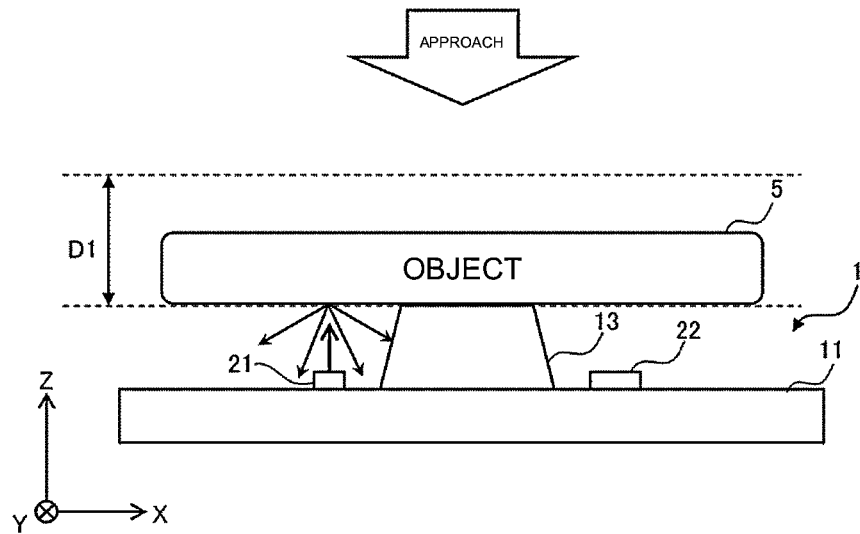

In addition, for example, as illustrated in FIG. 5B, when the target object 5 comes into contact with the force sensor 13, a force is applied from the target object 5 depending on the degree of contact. The force detection circuit 30 of the optical sensor 1 detects a force in multiple axes, for example, and generates a force detection signal.

In the optical sensor 1 of the present preferred embodiment, when the distance to the target object 5 becomes equal to or less than the threshold distance D1 from the state of FIG. 5A to the state of FIG. 5B, the reflected light L2 of the detection light L1 is blocked by the force sensor 13 and does not reach the light receiver 22. By using this phenomenon, the optical sensor 1 of the present preferred embodiment can output the proximity detection signal including information indicating whether or not the target object 5 approaches an area within the threshold distance D1 in accordance with the light reception result of the light receiver 22.

The detection result of the proximity around the threshold distance D1 as described above can be accurately obtained without depending on the reflectance of the target object 5. Further, the threshold distance D1 can be set to a desired distance in advance. Therefore, the optical sensor 1 of the present preferred embodiment can improve the accuracy of continuously detecting a series of processes from the approach of the target object 5 to the application of the contact force by using the threshold distance D1. Hereinafter, the operation of the optical sensor 1 will be described in detail.

2-2. Details of Operation

The operation of the optical sensor 1 of the present preferred embodiment begins, for example, when the presence of the target object 5 is confirmed by a control system of various robots in which the optical sensor 1 is applied to a robot hand or the like. An example of the operation of the optical sensor 1 in such a case will be described with reference to FIGS. 6A to 6E.

Figure 6A:
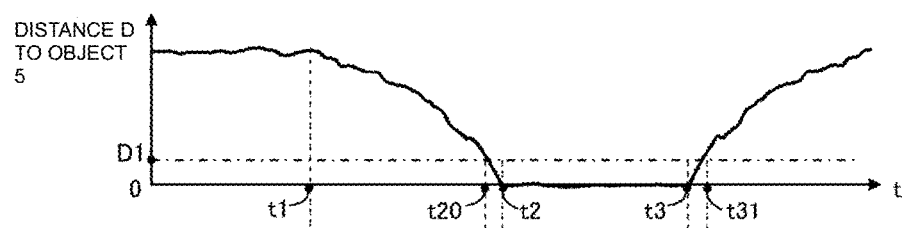
FIGS. 6A to 6E are timing charts illustrating the operation of the optical sensor.
Figure 6B:
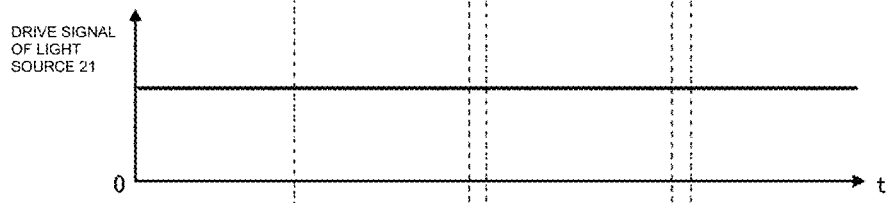
Figure 6C:
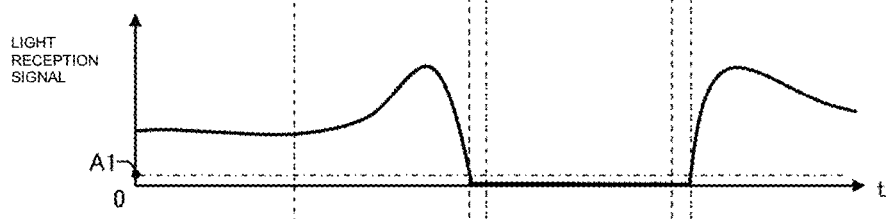
Figure 6D:
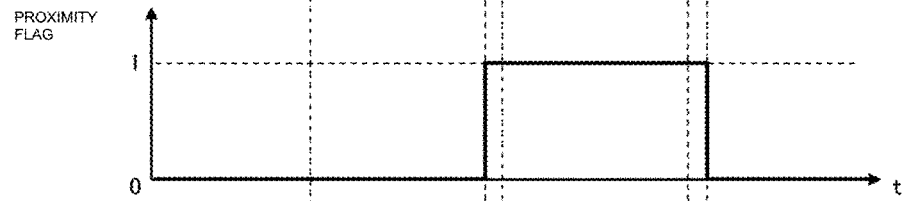
Figure 6E:
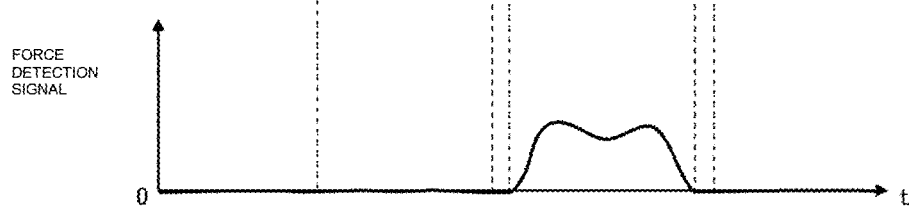

FIG. 6A is a graph illustrating an example of a change in the distance between the target object 5 and the optical sensor 1. FIG. 6B illustrates a drive signal of the light source 21. FIG. 6C illustrates a light reception signal in the light receiver (as an example of a proximity detection signal). FIG. 6D illustrates a proximity flag as an example of the proximity detection signal in the optical sensor 1. FIG. 6E illustrates a force detection signal in the optical sensor 1. The horizontal axis in FIGS. 6A to 6E represents time.

FIG. 6A illustrates a situation in which the target object 5 starts approaching the optical sensor 1 from a time t1 and comes into contact with the force sensor 13 at a time t2 (see FIGS. 5A and 5B). In this example, the optical sensor 1 emits the detection light L1 based on the drive signal illustrated in FIG. 6B, and irradiates the target object 5 with the detection light L1. The reflected light L2 of the detection light L1 in the target object 5 enters the light receiver 22 together with, for example, ambient light. FIG. 6C illustrates a light reception signal after ambient light is filtered by the optical sensor 1.

The optical sensor 1 may output a light reception signal as illustrated in FIG. 6C as an example of a proximity detection signal to the above-described control system or the like. In the situation of FIG. 6A, the signal level of the light reception signal gradually increases from the time t1 in accordance with the amount of the received reflected light L2. By such a change of the light reception signal, it can be detected that the target object 5 is approaching.

In the situation of FIG. 6A, the distance to the target object 5 reaches the threshold distance D1 at a time t20 immediately before the time t2 at which the target object 5 comes into contact with the force sensor 13. At this time, as illustrated in FIG. 6C, the light reception signal steeply decreases from a time before the time t20 and reaches a threshold light amount A1 at the time t20. Based on the signal level of the light reception signal, a timing at which the target object 5 reaches the threshold distance D1, that is, the timing immediately before contact can be detected.

As an example of a further proximity detection signal, the optical sensor 1 of the present preferred embodiment may generate a proximity flag as illustrated in FIG. 6D. The proximity flag is a flag indicating, by "1" or "0", whether or not the target object 5 has approached by the threshold distance D1 or more. According to the signal level of the light reception signal in FIG. 6C, the proximity flag rises from "0" to "1" at the time t20.

In addition, in the example of FIG. 6A, the target object 5 generates various contact forces in a period T11 during which the target object 5 is in contact with the force sensor 13 from the time t2 to a time t3. At this time, for example, as illustrated in FIG. 6E, the force detector 3 of the optical sensor 1 generates a force detection signal indicating the detection result of the contact force.

Further, the target object 5 in the example of FIG. 6A moves away from the force sensor 13 at the time t3, reaches the threshold distance D1 at a subsequent time t31, and moves away from the optical sensor 1. In the optical sensor 1, as illustrated in FIG. 6C, the signal level of the light reception signal steeply increases so as to exceed the threshold light amount A1 at the time t31. As illustrated in FIG. 6D, the proximity flag returns from "1" to "0" at the time t31. Note that the proximity flag as described above need not be generated in the optical sensor 1 and may be managed in the control system.

According to the operation of the optical sensor 1 described above, the contact force generated in the period T11 from the time t2 at which the target object 5 comes into contact to the time t3 can be detected by the force detection signal (FIG. 6E) of the optical sensor 1. Further, based on the proximity detection signal (FIGS. 6C and 6D), it can be detected that the target object 5 is in the vicinity of the optical sensor 1 (within the threshold distance D1) in a period T10 from the time t20 to the time t31 including the period T11. For example, it is possible to detect the timing immediately before the optical sensor 1 comes into contact at a time t21 at which the proximity flag rises. By such an operation of the optical sensor 1, for example, it is possible to easily perform planning when gripping the target object 5 in the control system.

For example, by applying the optical sensor 1 to an end effector (that is, a robot hand) of a robot arm such as, for example, a multi-finger hand or a gripper, it is possible to easily achieve gripping of the target object 5 such as, for example, a deformable object or a flexible object. In general, when the target object 5 is gripped by a robot arm, the target object 5 is recognized by a vision sensor such as, for example, a camera in a control system of a robot, and the robot arm is moved to a position where the target object 5 can be gripped. At this time, for example, due to a movable error of a movable portion such as, for example, a joint of the robot arm or the rigidity of the arm itself, there may be a problem in that the robot arm is displaced from a target position, does not perform an appropriate operation, and does not grip a deformable object or a flexible object. In addition, there may be a case where the target object 5 enters a blind spot of the vision sensor due to the movement of the robot arm, and the position of the target object 5 cannot be determined.

On the other hand, by using the end effector provided with the optical sensor 1 of the present preferred embodiment for the robot arm, it is possible to detect how close the end effector is to the target object 5 even when the robot arm is displaced from the target position. Therefore, it is possible to perform control to precisely correct the position of the robot arm and the operation of the end effector based on the information of the detection result of the proximity and the force by the optical sensor 1, and it is possible to grip a deformable object or a flexible object.

In addition, even when the target object 5 enters the blind spot of the vision sensor, the distance to the target object 5 can be estimated from the information of the detection result of the proximity by the optical sensor 1. Further, since the information of the detection result of the proximity and force of the target object 5 is obtained from one sensor, it is possible not only to formulate a gripping plan indicating how to grip the target object 5 before contacting the target object 5 but also to perform feedback control of gripping so as not to fail even when the gripping state changes while gripping the target object 5. Therefore, it is possible to efficiently grip a deformable object or a flexible object with few failures.

2-3. Numerical Simulation of Threshold Distance

With respect to the threshold distance D1 of the optical sensor 1 as described above, the inventors of preferred embodiments of the present invention conducted numerical simulations and confirmed the advantageous effects thereof. A numerical simulation of the threshold distance D1 in the optical sensor 1 will be described with reference to FIGS. 7 and 8.

Figure 7:
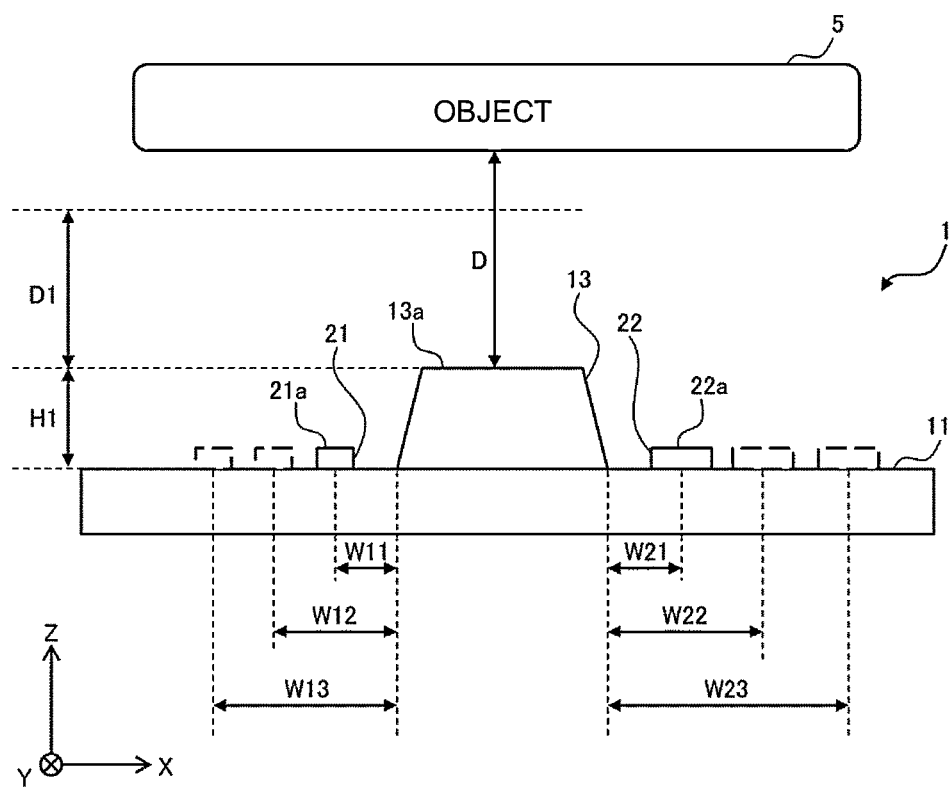
FIG. 7 is a diagram explaining an environment of a numerical simulation for the optical sensor.
Figure 8A:
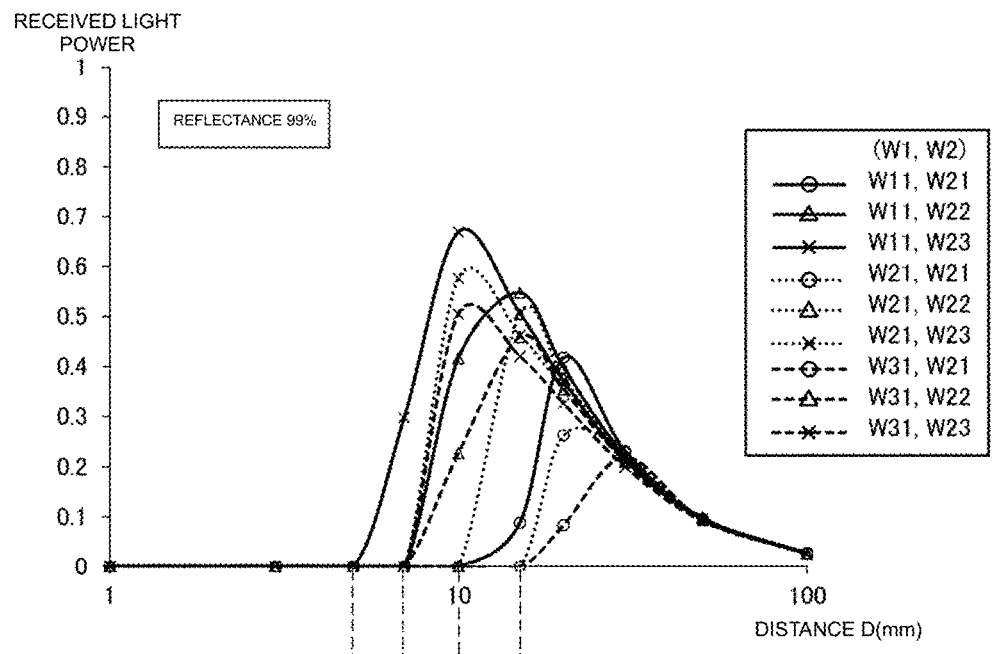
FIGS. 8A and 8B are diagrams illustrating a result of the numerical simulation for the optical sensor.
Figure 8B:
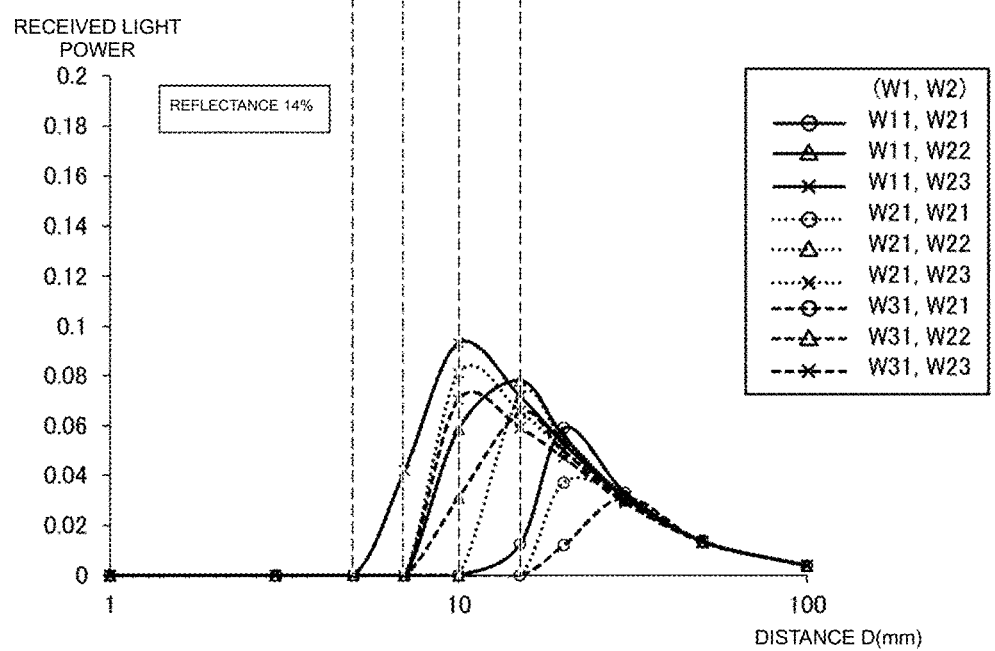

FIG. 7 is a diagram for explaining an environment of numerical simulation of the optical sensor 1. FIGS. 8A to 8B are diagrams illustrating a result of this simulation.

In this simulation, when the distance D to the target object 5 is changed at various intervals W1 and W2, received light power corresponding to the amount of the reflected light L2 of the detection light L1 received by the light receiver 22 is numerically calculated. In this simulation, as illustrated in FIG. 7, the interval W1 between the light source 21 and the force sensor 13 is defined by distances from the center position of the light source 21 to an end portion of the force sensor 13 in the X direction, and is increased in ascending order of W11, W12, and W13. Further, the interval W2 between the light receiver 22 and the force sensor 13 is defined by distances from the center position of the light receiver 22 to the end portion of the force sensor 13 in the X direction, and is increased in ascending order of W21, W22, and W23.

In this simulation, the reflectance of the target object 5 was changed, and the above numerical calculation for each case was performed. FIG. 8A illustrates a simulation result when the reflectance of the target object 5 is set to about 99%, for example. FIG. 8B illustrates a simulation result when the reflectance of the target object 5 is set to about 14%, for example. The horizontal axis of FIGS. 8A and 8B represents the distance D in the unit of mm. The vertical axis represents the received light power normalized to equal to or more than 0 and equal to or less than 1.

As illustrated in FIGS. 8A and 8B, when the reflectance of the target object 5 changes in this simulation, the received light power at various distances D fluctuates, but meanwhile the distance D when the received light power reaches "0", that is, the threshold distance D1, does not fluctuate. Therefore, according to this simulation, it was confirmed that the proximity detection of the threshold distance D1 can be performed in the optical sensor 1 regardless of the reflectance of the target object 5.

Further, in the simulation results of FIGS. 8A and 8B, when the interval W1 between the light source 21 and the force sensor 13 is decreased from "W13" to "W11" or the interval W2 between the light receiver 22 and the force sensor 13 is increased from "W21" to "W23", the threshold distance D1 is decreased. Therefore, it was confirmed that the threshold distance D1 can be set to a desired length by the layout of the light source 21, the light receiver 22, and the force sensor 13, such as by adjusting the intervals W1, W2, and the like. Depending on such a layout, for example, in consideration of the height H1 of the force sensor 13 or the like, the threshold distance D1 can be set to the vicinity of "0", and the position where the target object 5 comes into contact with the force sensor 13 can be set as the detection target.

3. Summary

As described above, the optical sensor 1 according to the present preferred embodiment detects proximity of the target object 5, which is any of various objects, in accordance with the light reception result of light. The optical sensor includes the light source 21 which is an example of a first light source, the light receiver 22 which is an example of a first light receiver, and the force sensor 13 which is an example of a convex portion. The light source 21 emits light such as the detection light L1 to the target object 5. The light receiver 22 receives the reflected light L2 of the emitted detection light L1 being reflected by the target object 5 and generates a light reception signal as a signal indicating a light reception result. The force sensor 13 has the height H1 higher than the height of the light source 21 and the light receiver 22. The force sensor 13 is arranged between the light source 21 and the light receiver 22 so as to block the reflected light L2 from the light receiver 22 when the detection light L1 from the light source 21 is reflected within a range of the threshold distance D1 (predetermined distance) from the force sensor 13. The light receiver 22 outputs a proximity detection signal such as a light reception signal so as to show a light reception result of equal to or less than the threshold light amount A1 indicating that the reflected light L2 is not received in response to the proximity of the target object 5 reaching within the range of the threshold distance D1. The threshold light amount A1 at which it can be considered that the reflected light L2 is not received is set in advance to, for example, equal to or less than about 10% of the optical output power output from the light source 21.

According to the above-described optical sensor 1, when proximity of the target object 5, which is various objects, is detected in accordance with the light reception result of the reflected light L2 from the target object 5, the light reception result of equal to or less than the threshold light amount A1 in which the reflected light L2 can be regarded as not being received can be obtained in response to the proximity of the target object 5 reaching within the range of the threshold distance D1. As a result, it is possible to detect that the target object 5 is close to the threshold distance D1 within the range of the reflectance in which the reflected light L2 from the target object 5 can be received by the light receiver 22, regardless of the reflectance of the target object 5.

For example, the light receiver 22 outputs a light reception signal so as to show a result that the reflected light L2 from the target object 5 is not received when the target object 5 approaches within the range of the threshold distance D1. In addition, the light receiver 22 receives the reflected light L2 that reaches the light receiver 22 without being blocked by the force sensor 13 in response to the proximity of the target object 5 from an outside of the range of the threshold distance D1. When the target object 5 moves out of the range of the threshold distances D1 from a state where the target object 5 is within the range of the threshold distance D1, the light receiver 22 outputs a light reception signal so as to show a light reception result that the reflected light L2 is getting to be received. With such a light reception signal, it is possible to easily detect the movement of the target object 5 that approaches around the threshold distance D1. Such proximity detection can be achieved by arranging the force sensor 13, the light source 21, and the light receiver 22 so as not to block at least a portion of the reflected light L2 from the light receiver 22 when the light from the light source 21 is reflected outside the range of the threshold distance D1.

In the present preferred embodiment, the force sensor 13 as a convex portion defines the force detector 3 that detects a force generated by contact with the target object 5. According to such the optical sensor 1, it is possible to continuously detect a series of processes in which the target object 5 approaches and comes into contact to generate a force.

Preferred Embodiment 2

In Preferred Embodiment 2 of the present invention, an example in which a detection result of proximity at the threshold distance D1 is utilized for power control of the force detector 3 will be described with reference to FIGS. 9 to 11.

Figure 9:
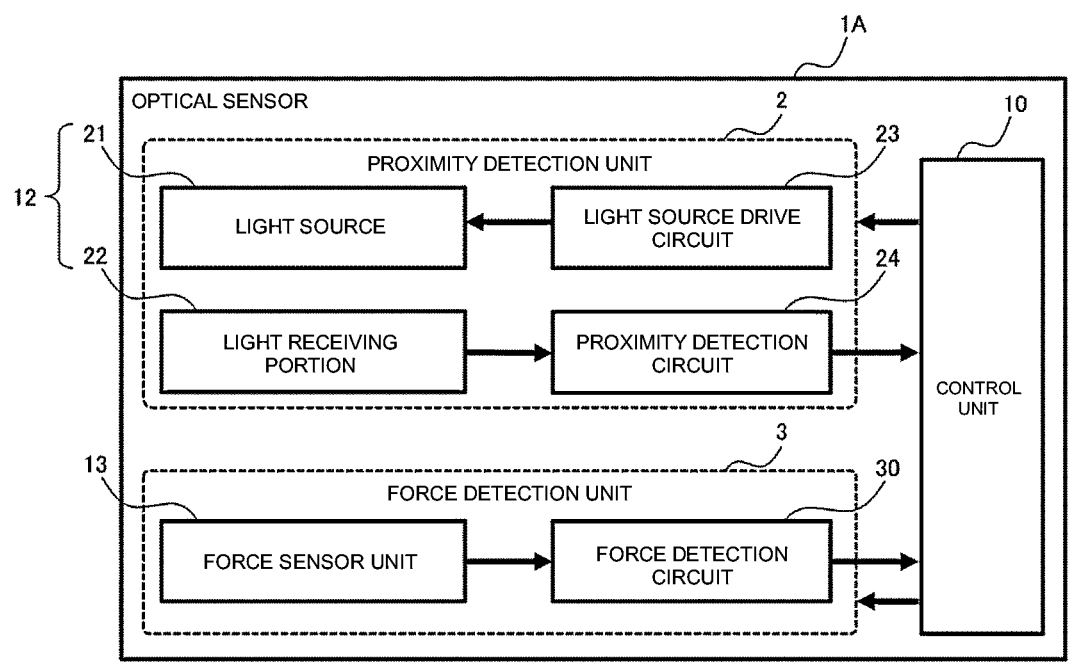
FIG. 9 is a block diagram illustrating a configuration of an optical sensor according to Preferred Embodiment 2 of the present invention.

FIG. 9 is a block diagram illustrating a configuration of an optical sensor 1A according to Preferred Embodiment 2. The optical sensor 1A of the present preferred embodiment further includes a controller 10 that controls operations of the force detector 3 and the proximity detector 2 in addition to, for example, a configuration the same as or similar to that of Preferred Embodiment 1 (see FIG. 3).

The controller 10 includes a microcomputer, for example, and provides a predetermined function in cooperation with software. The controller 10 includes an internal memory such as, for example, a ROM and a RAM, reads data and programs stored in the ROM to the RAM, performs various types of arithmetic processing, and performs various functions. The controller 10 may be a hardware circuit such as, for example, a dedicated electronic circuit designed to provide a predetermined function or a reconfigurable electronic circuit. The controller 10 may include various semiconductor integrated circuits such as, for example, a CPU, an MPU, a DSP, an FPGA, and an ASIC.

For example, the controller 10 has a function of controlling start/stop of operations of the force detector 3 and the proximity detector 2. The controller 10 may control electric power supplied to the force detector 3 and the proximity detector 2. The optical sensor 1A may be driven by electric power supplied from an external power source, or may incorporate a power source such as a battery, for example.

Figure 10:
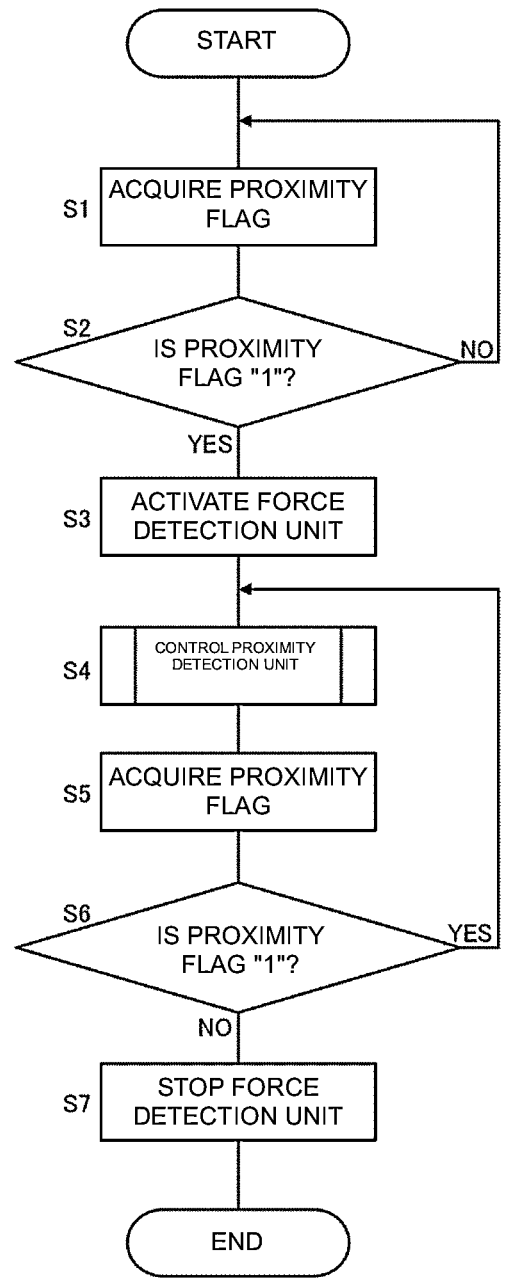
FIG. 10 is a flowchart illustrating an operation of the optical sensor according to Preferred Embodiment 2 of the present invention.

FIG. 10 is a flowchart illustrating the operation of the optical sensor 1A according to the present preferred embodiment. Hereinafter, an example in which the optical sensor 1A of the present preferred embodiment operates in the same or similar situation as in FIGS. 6A to 6E will be described.

The processing illustrated in the flowchart of FIG. 10 begins in a state where the operation of the force detector 3 is stopped. Each of the processing steps shown in this flowchart is performed by, for example, the controller 10 of the optical sensor 1A.

First, the controller 10 of the optical sensor 1A acquires a proximity flag from the proximity detection circuit 24 (S1), for example, and determines whether or not the acquired proximity flag is "1" (S2). Step S2 is performed to determine whether or not the target object 5 has approached within the range of the threshold distance D1.

For example, in an operation example the same as or similar to FIGS. 6A to 6E, since the proximity flag is "0" (NO in S2) during a period before the time t20 at which the target object 5 approaches the threshold distance D1, the processing of steps S1 and S2 is periodically repeated. At this time, the force detector 3 is maintained in a state in which the operation is stopped, and power consumption can be reduced. At the subsequent time t20, the proximity flag becomes "1", and the controller 10 proceeds to YES in step S2.

When determining that the acquired proximity flag is "1" (YES in S2), the controller 10 starts the operation of the force detector 3 (S3). For example, the controller 10 supplies operable power to the force sensor 13 and the force detection circuit 30. The force detector 3 in the present preferred embodiment starts an operation of generating a force detection signal from step S3, for example.

Thereafter, the controller 10 controls the operation of the proximity detector 2 based on, for example, the force detection signal (S4). According to step S4, the power consumption of the proximity detector 2 can also be reduced. The processing of step S4 will be described later. Note that the processing of step S4 may be omitted as appropriate.

Next, the controller 10 acquires the proximity flag from the proximity detection circuit 24 again (S5), and determines whether or not the acquired proximity flag is "1" (S6), for example, similarly to step S2. When the proximity flag is "1" (YES in S6), the controller 10 performs the processing of step S4 and subsequent steps again.

In the example of FIGS. 6A to 6E, since the proximity flag is "1" during the period T10 from the time t20 to the time t31 (YES in S6), the processing of steps S4 to S6 is performed. At this time, since the force detector 3 is in operation, a force detection signal corresponding to the period T10 in FIG. 6E is obtained in the present preferred embodiment. At the time t31, the proximity flag becomes "0", and the controller 10 proceeds to NO in step S6.

When determining that the acquired proximity flag is "0" (NO in S6), the controller 10 stops the operation of the force detector 3 (S7). For example, the controller 10 stops the supply of power to the force sensor 13 and the force detection circuit 30 or limits the power supply to standby power.

After the operation of the force detector 3 is stopped (S7), the controller 10 ends the processing illustrated in this flowchart. For example, the controller 10 repeats the above-described processing in a predetermined cycle.

According to the above-described processing, the power control of the force detector 3 is provided such that the force detector 3 is not operated unless the target object 5 approaches within the threshold distance D1 (NO in S2) based on the proximity flag. On the other hand, when the target object 5 approaches within the threshold distance D1 (YES in S2 and S6), the force detector 3 is activated (S3), and power saving can be achieved without failing to detect the force generated by the contact of the target object 5.

In the above description, an example in which the controller 10 acquires the proximity flag in steps S1 and S5 has been described, but instead of this, for example, a light reception signal may be acquired. The controller 10 can perform the same determination as in steps S2 and S6 based on the acquired light reception signal.

In the above description, an example in which the operation of the force detector 3 is started/stopped in steps S3 and S7 has been described, but is not particularly limited thereto, various types of power control to save power of the force detector 3 may be performed. The controller 10 may limit the operation so as to reduce the power consumption of the force detector 3 before step S3 and in step S7, and may release the limitation of the force detector 3 and operate the force detector 3 in step S3.

The processing in step S4 described above will be described with reference to FIG. 11. The processing illustrated in FIG. 11 is performed during the operation of the force detector 3.

First, the controller 10 acquires a force detection signal from the force detection circuit 30 of the force detector 3 (S21), and determines whether or not a contact force is detected based on the acquired force detection signal (S22). For example, when the contact force is not generated such as before the contact of the target object 5, the controller 10 proceeds to NO in step S22 and ends step S4 of FIG. 10. In this case, the operation of the proximity detector 2 continues (see step S5).

On the other hand, when the contact force is detected (YES in S22), it is considered that the target object 5 is in contact with the force sensor 13 and the proximity detector 2 does not need to be operated. In this case, the controller 10 controls the light source drive circuit 23 so as to turn off the light source 21 in the proximity detector 2, for example (S23). Thus, the power consumption of the proximity detector 2 can be reduced.

Thereafter, the controller 10 acquires the force detection signal from the force detection circuit 30 again (S24), and determines whether or not the contact force is detected (S25), for example, in the same or similar manner as in step S22. When the contact force is detected (YES in S25), the controller 10 performs the processing of step S24 and subsequent steps again.

On the other hand, when the contact force is no longer detected (NO in S25), the target object 5 may be in the vicinity of the optical sensor 1A. In this case, in order to operate the proximity detector 2 to detect the proximity of the target object 5, the controller 10 controls the light source drive circuit 23 to turn on the light source 21 that has been turned off, for example (S26).

When causing the proximity detector 2 to operate (S26), the controller 10 ends step S4 of FIG. 10 and proceeds to step S5.

According to the above-described processing, power control of the proximity detector 2 is achieved such that when the target object 5 comes into contact with the force sensor 13 and the contact force is detected based on the detection result of the force detector 3 (YES in S22 and S25), the proximity detector 2 is not operated (S23).

In step S23 described above, an example in which the light source 21 is turned off has been described, but is not particularly limited thereto, the controller 10 may perform various operation restrictions for saving power of the proximity detector 2. For example, the controller 10 may reduce the amount of light of the light source 21 or may reduce the gain of the sensor amplifier of the light receiver 22. In this case, the controller 10 returns the reduced amount of light or gain in step S26. Accordingly, it is possible to release the operation restriction of the proximity detector 2 and appropriately restore the operation state.

Figure 11:
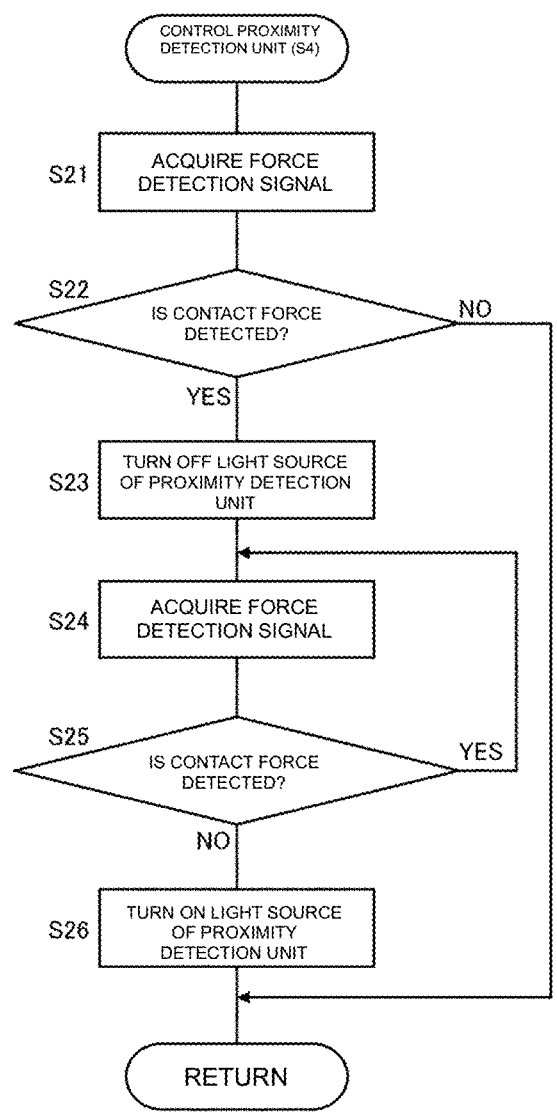
FIG. 11 is a flowchart illustrating an example of processing of step S4 in FIG. 10.

In addition, in the above description, an example in which the processing illustrated in FIGS. 10 and 11 is performed by the controller 10 of the optical sensor 1A has been described. Processing the same as or similar to that of FIGS. 10 and 11 may be performed by the control system to which the optical sensor 1A is applied. In this case, the CPU or the like that performs the processing is an example of the controller.

As described above, the optical sensor 1A of the present preferred embodiment further includes the controller 10 that controls the operation of the force detector 3 in accordance with the light reception signal output from the light receiver 22 via the proximity flag, for example. The controller 10 operates the force detector 3 (S3) in response to the light reception result of the threshold light amount A1 or less (YES in S2 and S6). The controller 10 limits the operation of the force detector 3 (S7) in response to the light reception result exceeding the threshold light amount A1 (NO in S2 and S6). As such, it is possible to limit the operation of the force detector 3 as long as the target object 5 is not close to the threshold distance D, and reduce the power consumption by the force detector 3.

Preferred Embodiment 3

In Preferred Embodiment 3 of the present invention, an example in which an optical method is used as a force detection method will be described with reference to FIGS. 12 to 15.

Figure 12:
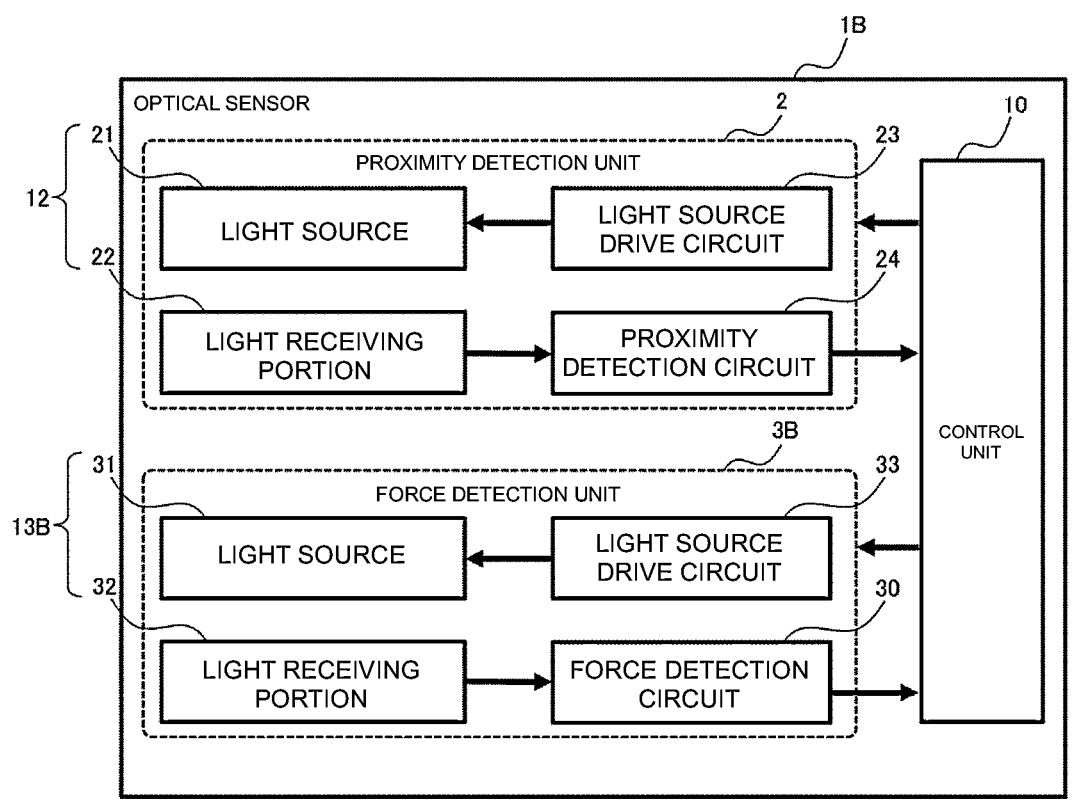
FIG. 12 is a block diagram illustrating a configuration of an optical sensor according to Preferred Embodiment 3 of the present invention.

FIG. 12 is a block diagram illustrating a configuration of an optical sensor 1B according to Preferred Embodiment 3. In the optical sensor 1B of the present preferred embodiment, for example, in the same or substantially the same configuration as the optical sensor 1A of Preferred Embodiment 2, an optical force detection method is used for a force detector 3B. The force detector 3B of the present preferred embodiment includes an optical force sensor 13B including a light source 31 and a light receiver 32, a light source drive circuit 33, and a force detection circuit 30.

Figure 13A:
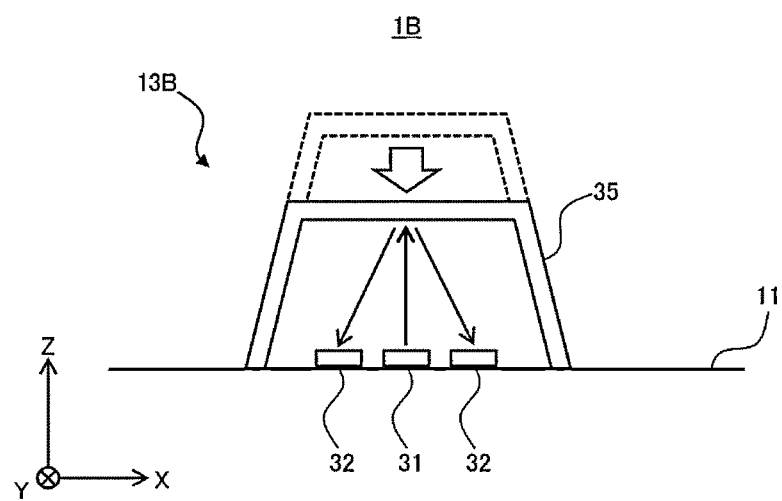
FIGS. 13A and 13B are diagrams explaining a force sensor of the optical sensor according to Preferred Embodiment 3 of the present invention.
Figure 13B:
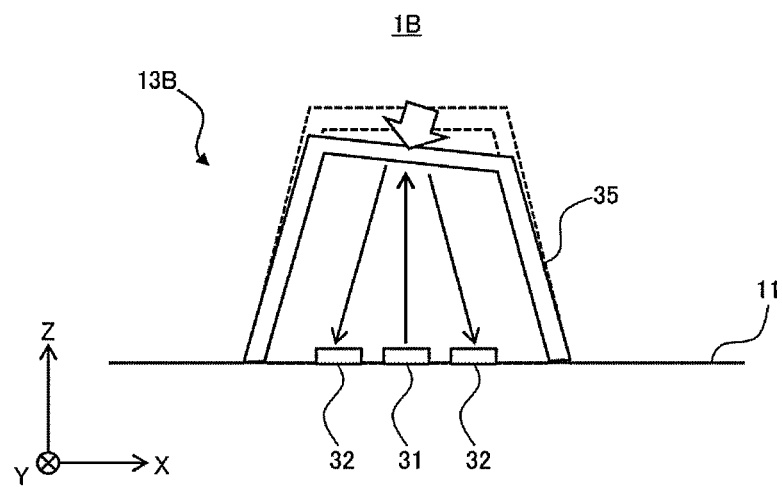

FIGS. 13A and 13B are diagrams for explaining the force sensor 13B of the optical sensor 1B in the present preferred embodiment. The optical force sensor 13B covers the light source 31 and the light receiver 32 with an elastic member 35 having a convex shape. Inside the force sensor 13B, for example, the light source 31 and the light receiver 32 are arranged on the substrate 11 so that the light receiver 32 surrounds the light source 31. The elastic member 35 may be made of various elastic bodies that deform in response to an external force such as a contact force applied by contact with the target object 5.

FIG. 13A illustrates a state in which a force directed in the Z direction acts on the force sensor 13B. FIG. 13B illustrates a state where a force in a direction different from that in FIG. 13A is applied.

In the optical force sensor 13B, the light source 31 emits light, and the light receiver 32 receives reflected light of the emitted light inside the elastic member 35. Here, when a force acts on the force sensor 13B, as illustrated in FIGS. 13A and 13B, the manner of deformation of the elastic member 35 changes depending on the difference in the acting force.

According to the optical force sensor 13B, various forces can be detected based on the light reception result of the light receiver 32 that changes in response to the deformation of the elastic member 35. The elastic member 35 may be provided with a reflecting portion that reflects light from the light source 31. Alternatively, in particular, no reflecting portion may be provided in the elastic member 35, and the reflected light from the target object 5 may be received by the light receiver 32 during contact between the elastic member 35 and the target object 5, or the like.

Similarly to the light source 21 of the proximity sensor 12, the light source 31 of the force sensor 13B includes various light emitters such as, for example, VCSELs. Similarly to the light receiver 22 of the proximity sensor 12, for example, the light receiver 32 of the force sensor 13B includes various light receivers such as, for example, a PD, and generates a light reception signal indicating a light reception result. The number of light receivers of the light receiver 32 of the force sensor 13B is, for example, three or more, and for example, four.

As shown in FIG. 12, the light source drive circuit 33 in the force detector 3B is configured in the same or substantially the same manner as the light source drive circuit 23 of the proximity detector 2, for example. In the force detection circuit 30B of the present preferred embodiment, light receivers included in the light receiver 32 are divided them into groups, for example, and the force detection circuit 30B calculates a difference between light reception signals of each group to generate a force detection signal capable of detecting forces of three axes.

When the same or substantially the same power control as that of Preferred Embodiment 2 is applied to the optical sensor 1B of the present preferred embodiment, for example, the controller 10 performs control such that the light source 31 is turned on in step S3 of FIG. 10 and the light source 31 is turned off in step S7. In the present preferred embodiment, various types of control the same as or similar to the power control (S23 and S26 in FIG. 11) of the proximity detector 2 can be applied to the power control (S3 and S7) of the optical force detector 3B.

Figure 14:
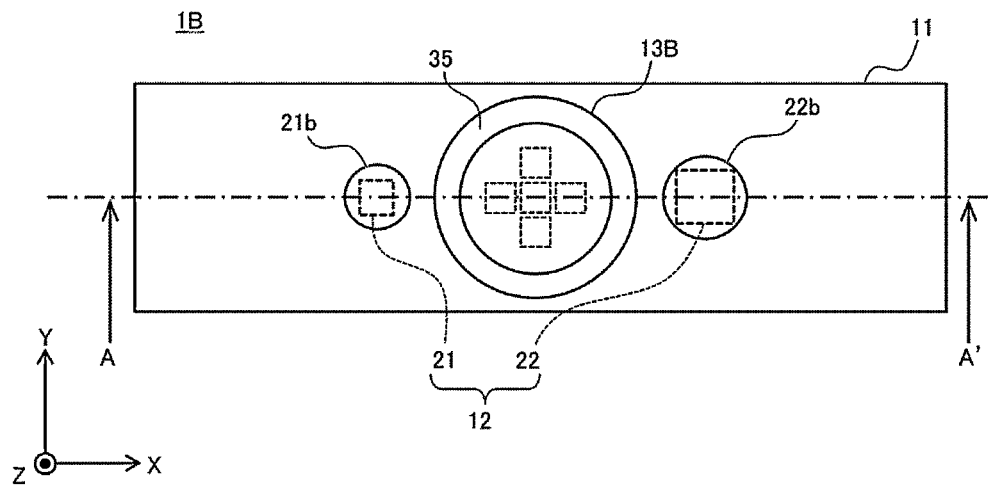
FIG. 14 is a plan view illustrating an example of the optical sensor according to Preferred Embodiment 3 of the present invention.
Figure 15:
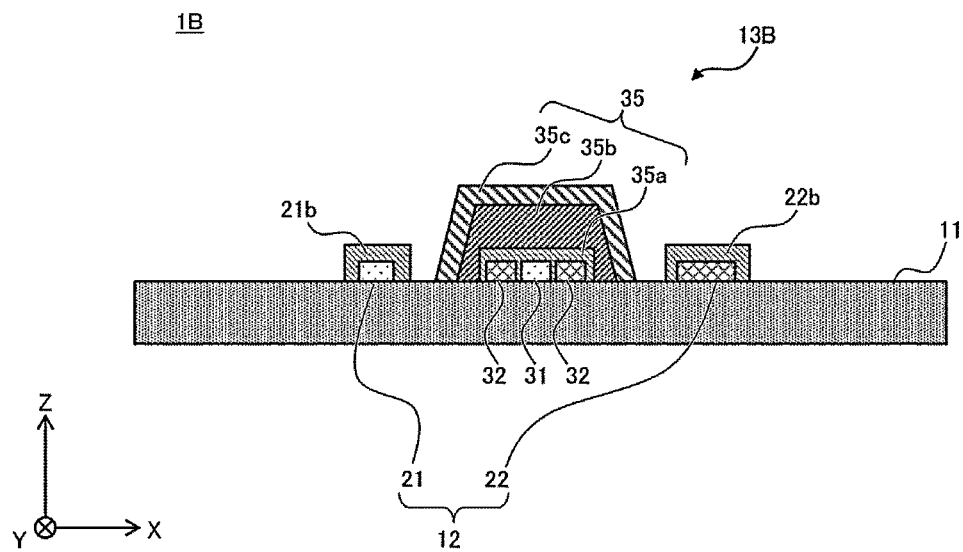
FIG. 15 is a cross-sectional view of the optical sensor illustrated in FIG. 14.

FIG. 14 is a plan view illustrating an example of the optical sensor 1B according to the present preferred embodiment. FIG. 15 illustrates a cross-sectional view of the optical sensor 1B corresponding to a line A-A' along the X direction in FIG. 14.

In the optical sensor 1B of the present preferred embodiment, the elastic member 35 includes three layers of resin bodies 35a, 35b, and 35c, as illustrated in FIG. 15, for example. The resin body 35a, which is a first layer, is made of, for example, a relatively hard resin and seals the light source 31 and the light receiver 32. The resin body 35b, which is a second layer, is made of, for example, a resin softer than the first layer resin body 35a, and seals the first layer resin body 35a. The resin body 35c, which is a third layer, seals the second layer resin body 35b.

In the present preferred embodiment, the light source 21 and the light receiver 22 of the proximity detector 2 may be sealed by resin bodies 21b and 22b, respectively. FIGS. 14 and 15 illustrate an example in which the resin bodies 21b and 22b are made of the same resin material as the first layer resin body 35a of the elastic member 35. By using the same resin material to seal the light source 21 and the light receiver 22 and for the elastic member 35, the manufacturing process can be integrated and the manufacturing of the optical sensor 1B can be facilitated.

The resin material that seals the light source 21 and the light receiver 22 may have a wavelength filter characteristic that selectively transmits the detection light L1 and the reflected light L2 thereof (see FIG. 1). The wavelength filter characteristics of the resin bodies 21b and 22b are optical characteristics in which light in a predetermined waveband shorter and/or longer than the vicinity of the peak wavelength of the detection light L1, for example, is blocked. The resin bodies 21b and 22b can easily reduce or prevent the influence of ambient light in proximity detection by the optical sensor 1B. For example, the resin body 35a of the elastic member 35 may also have a wavelength filter characteristic the same as or similar to that described above.

As the resin material of the resin bodies 35a, 35b, 35c, 21b, and 22b, for example, silicone-based resins such as methyl silicone, phenyl silicone, and modified silicone, or an epoxy resin can be used. In addition, the resin material that seals the light source 21 and the light receiver 22 is not limited to the first layer of the elastic member 35, and may be common to the resin bodies 35b and 35c of other layers. The elastic member 35 is not limited to three layers, and may include a resin body including two or less layers or four or more layers.

As described above, in the optical sensor 1B of the present preferred embodiment, the force detector 3B includes the light source 31 which is an example of a second light source, the light receiver 32 which is an example of a second light receiver, and the elastic member 35 of the force sensor 13B which is an example of a convex portion. The light source 31 emits light inside the elastic member 35. The light receiver 32 receives light inside the elastic member 35. The elastic member 35 is deformed in response to an external force. According to the optical sensor 1B of the present preferred embodiment, it is possible to achieve detection of force due to contact of the target object 5 by an optical force detection method.

In the present preferred embodiment, the elastic member 35 may include the resin body 35a as an example of a first resin body. The light source 21 and the light receiver 22 may be sealed by the resin bodies 21b and 22b as an example of a second resin body made of the resin material common to that of the first resin body. This makes it possible to facilitate the sealing process when manufacturing the optical sensor 1B.

In the present preferred embodiment, the resin bodies 21b and 22b may have wavelength filter characteristics that selectively transmit light emitted by the light source 21. As such, the influence of ambient light on the optical sensor 1B can be reduced or prevented.

Other Preferred Embodiments

In each of Preferred Embodiments 1 to 3 described above, the light receiver 22 is provided in the proximity sensor 12, but an additional light receiver may be provided. This modified example will be described with reference to FIG. 16.

Figure 16:
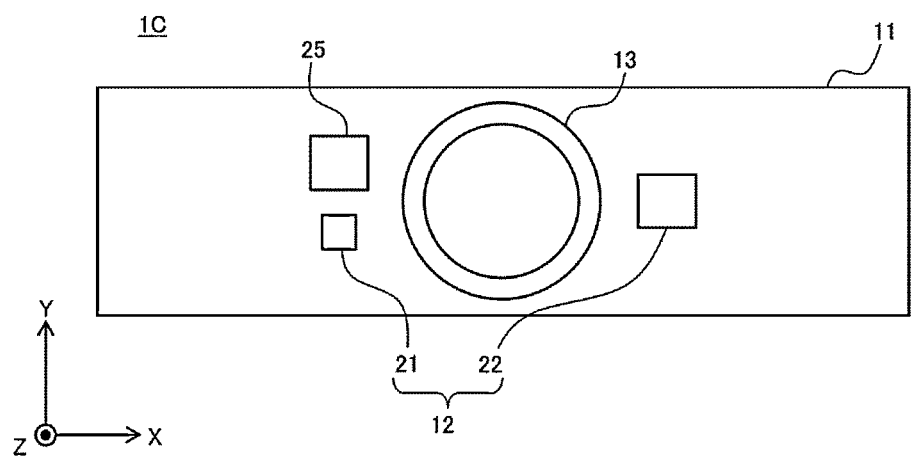
FIG. 16 is a plan view of an optical sensor according to a modified example of Preferred Embodiment 1 of the present invention.

FIG. 16 is a plan view of an optical sensor 1C according to the present modified example. The optical sensor 1C of the present modified example includes an additional light receiver 25 in addition to, for example, the same or similar configuration as that of Preferred Embodiment 1 (see FIG. 2). FIG. 16 illustrates an example in which the additional light receiver 25 is adjacent to the light source 21. The position of the light receiver 25 may be various positions at which the reflected light L2 of the detection light L1 at the threshold distance D1 can be received.

In the present modified example, the additional light receiver 25 is configured in the same or substantially the same manner as the light receiver 22 of the proximity sensor 12, for example, and generates a light reception signal. The optical sensor 1C may further include various circuit configurations to process a light reception signal from the additional light receiver 25. According to the light reception signal from the additional light receiver 25, when the signal level of the light reception signal of the light receiver 22 of the proximity sensor 12 is, for example, near "0", it is possible to determine whether the target object 5 is in the threshold distance D1 or the target object 5 is not present.

Further, by arranging the additional light receiver 25 adjacent to the light source 21, changes in the characteristics of the light source 21 due to changes in ambient temperature or deterioration over time can be monitored from the light reception signal of the light receiver 25, and can be utilized for temperature compensation or detection of failure of the optical sensor 1C.

As in the above modified example, the optical sensor 1C of the present preferred embodiment may further include the light receiver 25 as an example of a third light receiver to receive the reflected light L2 when the detection light L1 emitted from the light source 21 is reflected at the threshold distance D1.

Figure 17:
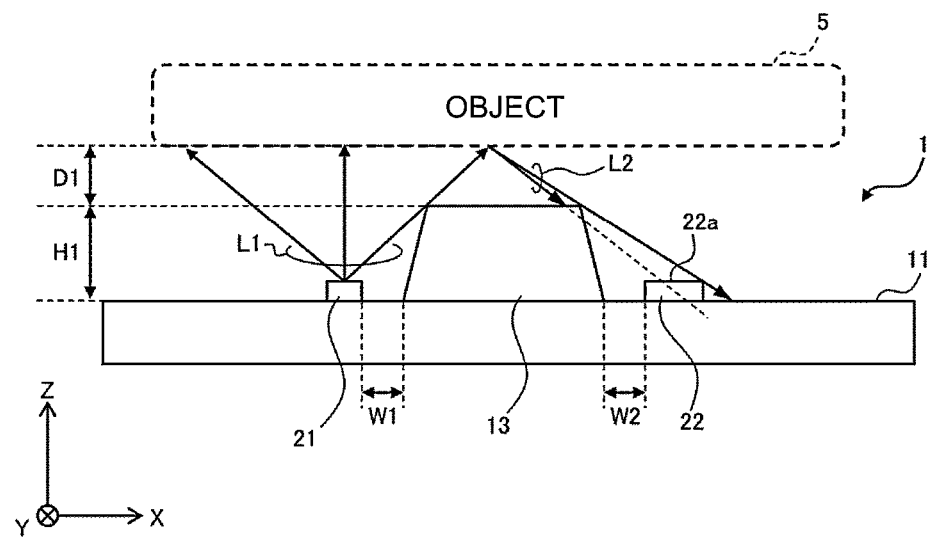
FIG. 17 is a diagram illustrating a modified example of a threshold distance in an optical sensor.

In each of the preferred embodiments described above, an example in which the light source 21 has narrow directivity has been described. However, the directivity of the light source 21 is not particularly limited, and may be wide directivity. FIG. 17 illustrates an example of the threshold distance D1 when the light source 21 has wide directivity. In the present preferred embodiment, the threshold distance D1 of the optical sensor 1 can be appropriately set in consideration of also the directivity of the light source 21.

Further, in each of the preferred embodiments described above, the optical sensor 1 that detects the distance to the target object 5 based on the amount of the reflected light L2 according to the light reception signal of the light receiver 22 of the proximity sensor 12 has been described. The optical sensor according to the present preferred embodiment may detect the distance to the target object 5 based on not only the amount of the reflected light L2 but also a phase difference. For example, by synchronizing the proximity detection circuit 24 and the light source drive circuit 23, the phase difference from when the detection light L1 is emitted from the light source 21 to when the reflected light L2 is received can be detected from the light reception signal of the light receiver 22, and the phase difference corresponds to the distance to the target object 5. Even in such a detection method, when the target object 5 approaches within the threshold distance D1, the signal level of the light reception signal of the light receiver 22 becomes "0". Therefore, by using such a change in the light reception result, the proximity to the threshold distance D1 can be accurately detected regardless of the reflectance of the target object 5.

Further, in each of the above-described preferred embodiments, an example in which the convex portion of the optical sensor defines the force detector 3 has been described. In the present preferred embodiment, the convex portion of the optical sensor does not particularly need to define the force detector. For example, the convex portion of the optical sensor may be a member having a function different from that of the force sensor 13 or may be a simple structure. Such a convex portion can also cause a phenomenon of blocking the reflected light L2 from the light receiver 22 in the threshold distance D1, and can accurately detect the proximity of the target object 5 in the threshold distance D1, similarly to the above-described preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical sensor for detecting proximity of an object in accordance with a light reception result, the optical sensor comprising:
   a first light source to emit light to the object;
   a first light receiver to receive reflected light of emitted light being reflected by the object and generate a signal indicating a light reception result; and a convex portion having a height higher than a height of the first light source and the first light receiver; wherein the convex portion is between the first light source and the first light receiver so as to block the reflected light from the first light receiver when light from the first light source is reflected within a range of a predetermined distance from the convex portion;

the first light receiver outputs the signal to show a light reception result of equal to or less than a threshold amount of light indicating that the reflected light is not received in response to proximity of the object being within a range of the predetermined distance; and the convex portion defines a force detector to detect a force generated by contact of the object.

2. The optical sensor according to claim 1, further comprising:

a controller to control an operation of the force detector in accordance with a signal output from the first light receiver; wherein wherein the controller is configured or programmed to cause the force detector to operate in response to a light reception result of equal to or less than the threshold amount of light, and to limit an operation of the force detector in response to a light reception result exceeding the threshold amount of light.

3. The optical sensor according to claim 1, wherein the force detector includes:

a second light source to emit light inside the convex portion; and a second light receiver to receive light inside the convex portion; wherein the convex portion is defined by an elastic member that deforms in response to an external force.

4. The optical sensor according to claim 3, wherein the elastic member includes a first resin body; and the first light source and the first light receiver are sealed by a second resin body made of a same resin material as a resin material of the first resin body.

5. The optical sensor according to claim 4, wherein the second resin body has a wavelength filter characteristic that selectively transmits light emitted by the first light source.

6. The optical sensor according to claim 1, further comprising a third light receiver to receive reflected light when light emitted from the first light source is reflected at the predetermined distance.

7. The optical sensor according to claim 1, wherein the first light source and the first light receiver define a proximity detector.

8. The optical sensor according to claim 1, wherein the first light source includes a single or multi-emitter surface emitting laser.

9. The optical sensor according to claim 1, wherein the first light source includes a semiconductor laser or a light emitting diode.

10. The optical sensor according to claim 1, wherein the first light receiver includes a photodiode.

11. The optical sensor according to claim 1, wherein the first light receiver includes a phototransistor, a position detector, a CMOS image sensor, or a charge-coupled device.

12. The optical sensor according to claim 1, further comprising a light source device circuit to supply a drive signal to the first light source to emit light to the object.

13. The optical sensor according to claim 1, wherein the light source drive circuit includes a modulator.

14. The optical sensor according to claim 1, further comprising a proximity detection circuit to drive the first light receiver.

15. The optical sensor according to claim 1, wherein the proximity detection circuit includes a sensor amplifier to amplify the signal output from the first light receiver.

* * * * *